United States Patent
Lee

(10) Patent No.: US 6,512,403 B2
(45) Date of Patent: Jan. 28, 2003

(54) PHASE-LOCKED LOOP FOR REDUCING FREQUENCY LOCK TIME

(75) Inventor: Han-il Lee, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/034,891

(22) Filed: Dec. 20, 2001

(65) Prior Publication Data

US 2002/0109537 A1 Aug. 15, 2002

(30) Foreign Application Priority Data

Feb. 14, 2001 (KR) ............................................. 01-7273
May 31, 2001 (KR) ............................................. 01-30526

(51) Int. Cl.[7] .............................................. H03K 17/04
(52) U.S. Cl. ...................................... 327/156; 375/376
(58) Field of Search ................................. 327/141, 142, 327/146–150, 155–159, 162, 163; 375/373–376; 331/17, DIG. 2

(56) References Cited

U.S. PATENT DOCUMENTS

| | | | | |
|---|---|---|---|---|
| 5,596,300 A | * | 1/1997 | Dietrich et al. ............. 327/156 |
| 5,692,023 A | * | 11/1997 | Clark ........................... 331/14 |
| 5,757,216 A | * | 5/1998 | Murata ........................ 327/147 |
| 6,031,429 A | * | 2/2000 | Shen ........................... 327/156 |
| 6,222,401 B1 | * | 4/2001 | Yoon ........................... 327/156 |
| 6,313,708 B1 | * | 11/2001 | Beaulieu ...................... 327/156 |

* cited by examiner

*Primary Examiner*—My-Trang Nuton
(74) *Attorney, Agent, or Firm*—F. Chau & Associates, LLP

(57) ABSTRACT

A phase-locked loop circuit includes a phase detector for comparing the phase of a reference clock signal with the phase of a feedback clock signal and detecting a phase difference between the two; a loop filter in signal communication with the phase detector; a fast frequency lock control circuit in signal communication with the phase detector for disconnecting the phase detector from the loop filter at the initial stage of power on of the phase-locked loop circuit, at least one of supplying constant current to the loop filter for a predetermined time duration and emitting constant current from the loop filter, and then connecting the phase detector to the loop filter; a voltage controlled oscillator in signal communication with the loop filter for generating an output clock signal and varying the frequency of the output clock signal in response to output voltage of the loop filter; and a divider in signal communication with the voltage controlled oscillator for dividing the output clock signal at a predetermined division rate and supplying the divided clock signal as the feedback clock signal.

20 Claims, 4 Drawing Sheets

PHASE-LOCKED LOOP FOR REDUCING FREQUENCY LOCK TIME

BACKGROUND OF THE INVENTION

1. Field of the Disclosure

The present disclosure relates to a phase-locked loop ("PLL") circuit, and more particularly, to a PLL circuit for reducing frequency lock time and improving operational characteristics, and further relates to an associated method for reducing frequency lock time for PLL circuits.

2. Description of Related Art

A phase-locked loop ("PLL") circuit is a circuit for comparing the phase of a reference clock signal with the phase of a signal fed back from a voltage controlled oscillator ("VCO"), and synchronizing the two phases. A PLL circuit is used in various fields, such as, for example, in communication systems.

As shown in FIG. 1, a PLL circuit includes a phase detector 11 for comparing the phase of a reference clock signal fr with the phase of a feedback clock signal fv and detecting a phase difference, a loop filter 13, a VCO 15 for generating an output clock signal of and varying the frequency of the output clock signal of in response to an output voltage Vc of the loop filter 13, and a divider 17 for dividing the output clock signal of at a predetermined division rate N and supplying the divided clock signal as a feedback clock signal fv.

A method for reducing frequency lock time in the PLL circuit of FIG. 1 might be to control some loop parameters and to vary a loop bandwidth. However, this method has disadvantages including that it cannot reduce frequency lock time sufficiently.

SUMMARY OF THE INVENTION

These and other drawbacks and disadvantages are addressed by a phase-locked loop ("PLL") circuit having a phase detector for comparing the phase of a reference clock signal with the phase of a feedback clock signal and detecting a phase difference between the two; a loop filter in signal communication with the phase detector; a fast frequency lock control circuit in signal communication with the phase detector for disconnecting the phase detector from the loop filter at the initial stage of power on of the phase-locked loop circuit, at least one of supplying constant current to the loop filter for a predetermined time duration and emitting constant current from the loop filter, and then connecting the phase detector to the loop filter; a voltage controlled oscillator in signal communication with the loop filter for generating an output clock signal and varying the frequency of the output clock signal in response to output voltage of the loop filter; and a divider in signal communication with the voltage controlled oscillator for dividing the output clock signal at a predetermined division rate and supplying the divided clock signal as the feedback clock signal.

In operation, the phase detector compares the phase of a reference clock signal with the phase of a feedback clock signal and detects a phase difference. The fast frequency lock control circuit disconnects the phase detector from the loop filter at the initial stage of power on of the PLL circuit and supplies constant current to the loop filter for a predetermined time duration, or emits constant current from the loop filter and then connecting the phase detector to the loop filter. The voltage-controlled oscillator generates an output clock signal and varies the frequency of the output clock signal in response to output voltage of the loop filter. The divider divides the output clock signal at a predetermined division rate and supplies the divided clock signal as the feedback clock signal.

According to a preferred embodiment, the fast frequency lock control circuit includes a constant current source, one end of which is maintained at a first reference voltage, a first switch connected between the other end of the constant current source and the loop filter, a second switch connected between the phase detector and the loop filter, and a control circuit for turning on the first switch and turning off the second switch for the predetermined time duration, and for turning off the first switch and turning on the second switch after the predetermined time duration, in response to input data and a control clock signal.

A preferred feature is that the input data be the division rate of the divider, and that the control clock signal be the same as the reference clock signal. Another preferred feature is that the control circuit be implemented by a lock-detecting counter included in the PLL circuit, and that the constant current source be implemented by a charge pump included in the phase detector.

According to another preferred embodiment, the fast frequency lock control circuit includes a first constant current source, one end of which is maintained at a first reference voltage, a first switch connected between the other end of the first constant current source and the loop filter, a second switch connected between the phase detector and the loop filter, a second constant current source, one end of which is maintained at a second reference voltage, a third switch connected between the other end of the second constant current source and the loop filter, a fourth switch connected between the loop filter and the voltage controlled oscillator, and a control circuit for turning on one of the first switch and the third switch and turning off the second switch and the fourth switch for the predetermined time duration, and for turning off the first switch and the third switch and turning on the second switch and the fourth switch after the predetermined time duration, in response to input data and a control clock signal.

A preferred feature is that the input data is the division rate of the divider, and the control clock signal is the same as the reference clock signal. Another preferred feature is that the control circuit be implemented by a lock detecting counter included in the PLL circuit, and that the first constant current source and the second constant current source be implemented by a charge pump included in the phase detector.

A method for reducing frequency lock time of a phase-locked loop circuit includes the steps of disconnecting the phase detector from the loop filter at the initial stage of power on of the PLL circuit and supplying constant current to the loop filter for a predetermined time duration, or emitting constant current from the loop filter, and connecting the phase detector to the loop filter after the predetermined time duration.

According to another preferred embodiment, the step of supplying the constant current to the loop filter includes the steps of generating the constant current, and connecting a path of the constant current to the loop filter and disconnecting the phase detector from the loop filter for the predetermined time duration in response to input data and a control clock signal. A preferred feature is that the input data be the division rate of the divider, and that the control clock signal be the same as the reference clock signal.

These and other aspects, features and advantages of the present disclosure will become apparent from the following description of exemplary embodiments, which is to be read in connection with the accompanying drawings.

BRIEF DESCRIPTION OF THE DRAWINGS

The above objects and advantages of the present disclosure will become more apparent with reference to the attached drawings in which.

DETAILED DESCRIPTION OF PREFERRED EMBODIMENTS

Figure 1:
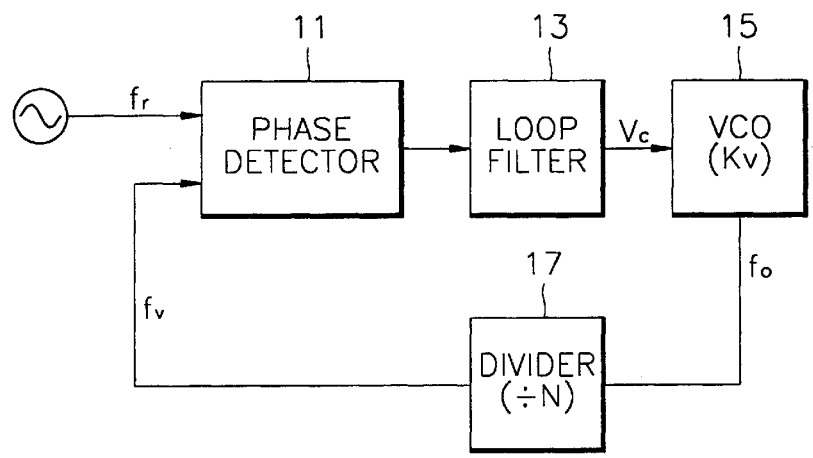
FIG. 1 shows a block diagram of a phase-locked loop ("PLL") circuit.

The present disclosure will be described more fully hereinafter with reference to the accompanying drawings in which preferred embodiments of the disclosure are shown. Like reference numerals refer to like elements in the several Figures.

Figure 2:
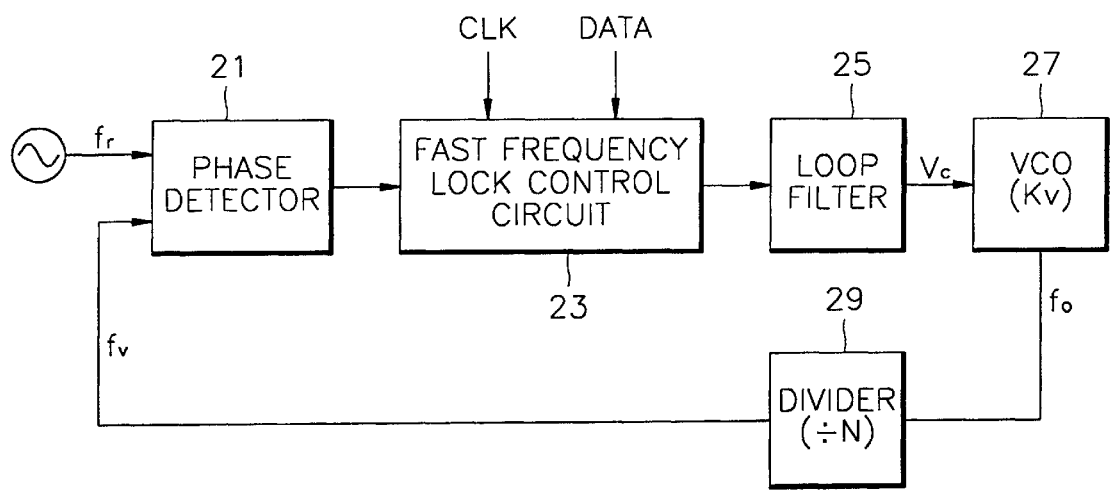
FIG. 2 shows a block diagram of a phase-locked loop ("PLL") circuit according to a preferred embodiment of the present disclosure.

FIG. 2 shows a block diagram of a phase-locked loop ("PLL") circuit according to a preferred embodiment of the present disclosure. Referring to FIG. 2, the phase-locked loop ("PLL") circuit includes a phase detector 21, a loop filter 25, a voltage controlled oscillator ("VCO") 27, a divider 29, and particularly, a fast frequency lock control circuit ("FFLC") 23.

The phase detector 21 compares the phase of a reference clock signal fr with the phase of a feedback clock signal fv and detects a phase difference. The fast frequency lock control circuit ("FFLC") 23 disconnects the phase detector 21 from the loop filter 25 at the initial stage of power on of the PLL circuit, supplies constant current to the loop filter 25 for a predetermined time duration Δt, and then connects the phase detector 21 to the loop filter 25. In other words, the FFLC 23 supplies constant current I to the loop filter 25 for the predetermined time duration Δt, calculated by using input data DATA and system parameters, and generates control voltage Vc compulsorily, which is required in order for the voltage controlled oscillator ("VOC") 27 to obtain a desired target frequency of an output clock signal of.

The VOC 27 generates the output clock signal of and varies the frequency of the output clock signal of in response to the output voltage of the loop filter 25, that is, the control voltage Vc. The divider 29 divides the output clock signal of at a predetermined division rate N and supplies the divided clock signal as a feedback clock signal fv.

Figure 3:
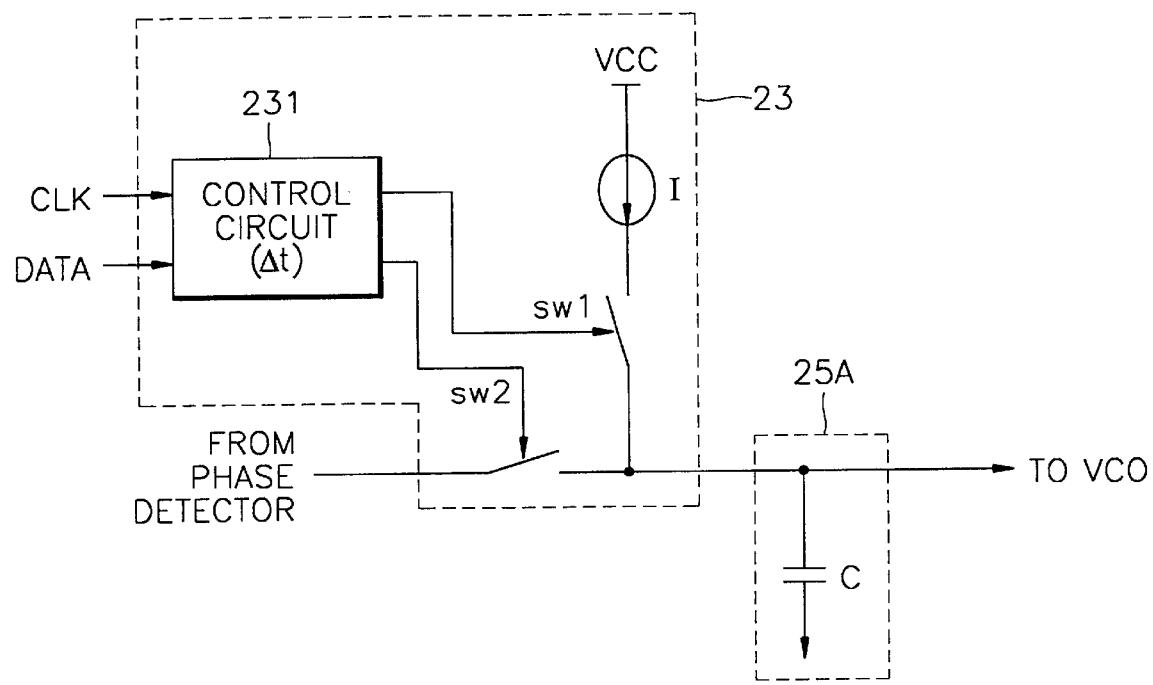
FIGS. 3 and 4 show circuit diagrams illustrating an embodiment of a fast frequency lock control circuit of FIG. 2.
Figure 4:
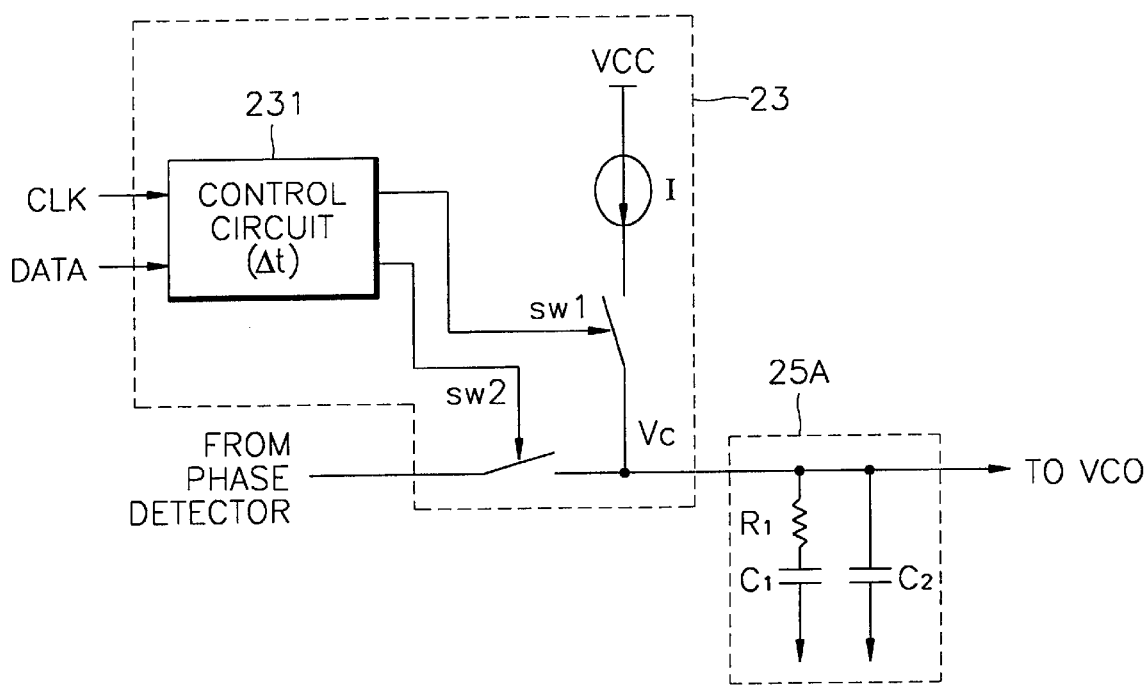

FIGS. 3 and 4 show circuit diagrams illustrating a first embodiment of a fast frequency lock control circuit ("FFLC") of FIG. 2. FIG. 3 illustrates a case where the loop filter is a first order loop filter 25A, and FIG. 4 illustrates a case where the loop filter is a second order loop filter 25B.

Referring to FIGS. 3 and 4, a fast frequency lock control circuit ("FFLC") 23A according to the first embodiment includes a constant current source 1, one end of which is connected to a supply voltage VCC, a first switch sw1 which is connected between the other end of the constant current source I and a loop filter 25A or 25B, a second switch sw2 which is connected between the phase detector 21 and the loop filter 25A or 25B, and a control circuit 231.

The control circuit 231 turns on the first switch sw1 and turns off the second switch sw2 for a predetermined time duration Δt in response to input data DATA and a control clock signal CLK. As a result, current is supplied to the loop filter 25A or 25B for the predetermined time duration Δt. In addition, the control circuit 231 turns off the first switch sw1 and turns on the second switch sw2 after the predetermined time duration Δt.

Preferably, the input data DATA is the same as a division rate N of the divider 29 of FIG. 2, and the control clock signal CLK is the same as the reference clock signal fr of FIG. 2. However, externally applied data may be used as the input data DATA, and a clock signal may be used as the control clock signal CLK.

The control circuit 231 may be implemented by a lock-detecting counter included in the PLL circuit, and the constant current source I may be implemented by a charge pump included in the phase detector 21.

Hereinafter, a method for reducing frequency lock time of the PLL circuit according to the present disclosure will be described with reference to FIGS. 2 through 4. The frequency of of the output clock signal in a frequency synthesizer having a phase-locked loop shape is obtained by Equation 1.

$$fo=NWfr \qquad \text{[Equation 1]}$$

Here, a natural number N is determined by input data DATA, and fr is the frequency of a reference clock signal. In addition, an equation related to input and output of the VCO 27 is expressed by Equation 2.

$$fo=KvWVc \qquad \text{[Equation 2]}$$

Here, Kv is the gain of the VCO 27, and Vc is the output voltage of the loop filter 25, that is, control voltage Vc.

As can be seen from Equation 2, since Kv is determined by the VCO 27, in order to obtain a desired frequency of, the control voltage Vc should be input to the VCO 27.

In the PLL circuit of FIG. 1, the control voltage Vc is determined by a negative feedback operation in a state where the PLL is closed. On the other hand, in the PLL circuit according to the present disclosure, the fast frequency lock control circuit 23 makes the PLL into an open loop at the initial stage of power on, and constant current I flows in the loop filter 25 for the predetermined time duration Δt in order to generate the control voltage Vc required to obtain a desired frequency of in the open loop state.

In a case where the loop filter consists of the first order loop filter 25A, as shown in FIG. 3, variation in voltage Vc between both ends of a capacitor C when the constant current I flows in the loop filter 25A for the predetermined time duration t is expressed by Equation 3.

$$Vc2-Vc1=x \; Vc=x \; Q/C=IWx \; t/C \qquad \text{[Equation 3]}$$

Here, Vc1 is the value of the initial state of the control voltage Vc, and Vc2 is the value of the later state of the control voltage Vc. Q is the amount of charge which is stored in the capacitor C for a time duration Δt by the constant current I. Thus, the time duration Δt is obtained by combining Equations 1 through 3 to get Equation 4.

$$x=CWxfo/KvWI=CWfrWx \; N/KvWI=KWx \; N \qquad \text{[Equation 4]}$$

As can be seen from Equation 4, the time duration t is determined by N if parameters C, fr, Kv, and I are defined. N is determined by the input data DATA and is preferably the same as the division rate N of the divider 29.

More specifically, in the present disclosure, the control circuit 231 of the fast frequency lock control circuit 23 receives the input data DATA corresponding to N and a control clock signal CLK, turns on the first switch sw1 and turns off the second switch sw2 for the time duration Δt. As a result, the phase detector 21 is disconnected from the loop filter 25, the PLL is open, and the constant current I is supplied to the loop filter 25 for the time duration Δt in the open loop state. Thus, the control voltage Vc required to obtain a desired frequency of is generated and is supplied to the VCO 27.

After the time duration Δt, the control circuit 231 turns off the first switch sw1 and turns on the second switch sw2. As a result, the phase detector 21 is reconnected to the loop filter 25, and the PLL is closed and returned to a normal state.

Meanwhile, as shown in FIG. 4, in a case where the loop filter consists of the second order loop filter 25B, the time duration Δt is given by Equation 5 whose derivation is well known to one with ordinary knowledge of circuit theory.

$$x\ t=(C1+C2)WfrWx\ N/KvWI=KWx\ N \quad \text{[Equation 5]}$$

As described above, in the PLL circuit according to the present disclosure, the constant current I is supplied to the loop filter 25 at the initial stage of power on in a state where the PLL is open for the predetermined time duration Δt, thereby performing fast frequency lock. Further, the constant current I is only for frequency lock in the open loop state, and the constant current I is increased regardless of loop stability, thereby further quickening frequency lock.

Further, in the PLL circuit according to the present disclosure, current flowing in a charge pump in the phase detector 21 in the closed loop state is reduced after the frequency is locked, that is, a loop bandwidth is reduced, thereby reducing phase noise and reference spur.

Figure 5:
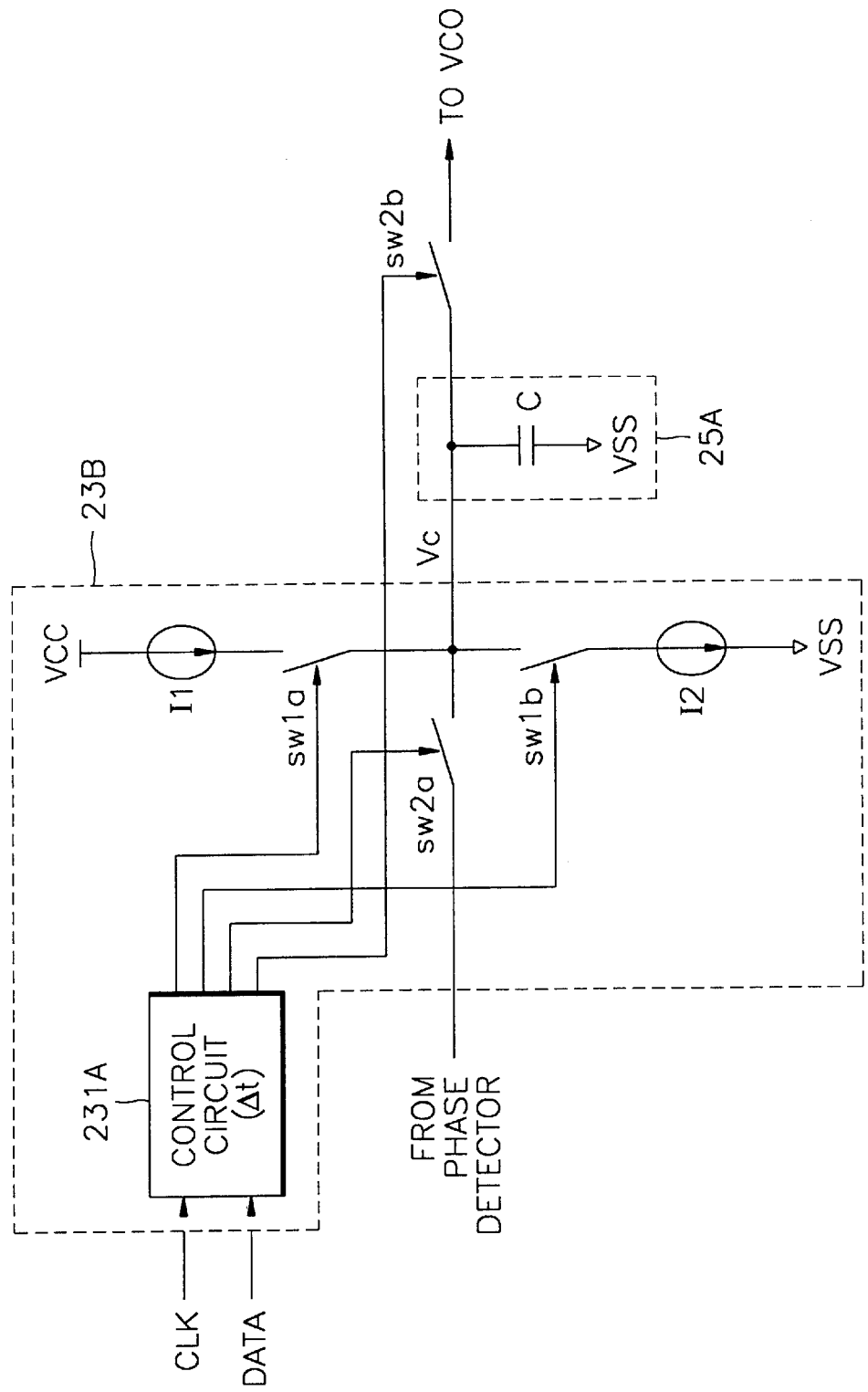
FIGS. 5 and 6 show circuit diagrams illustrating another embodiment of the fast frequency lock control circuit of FIG. 2.
Figure 6:
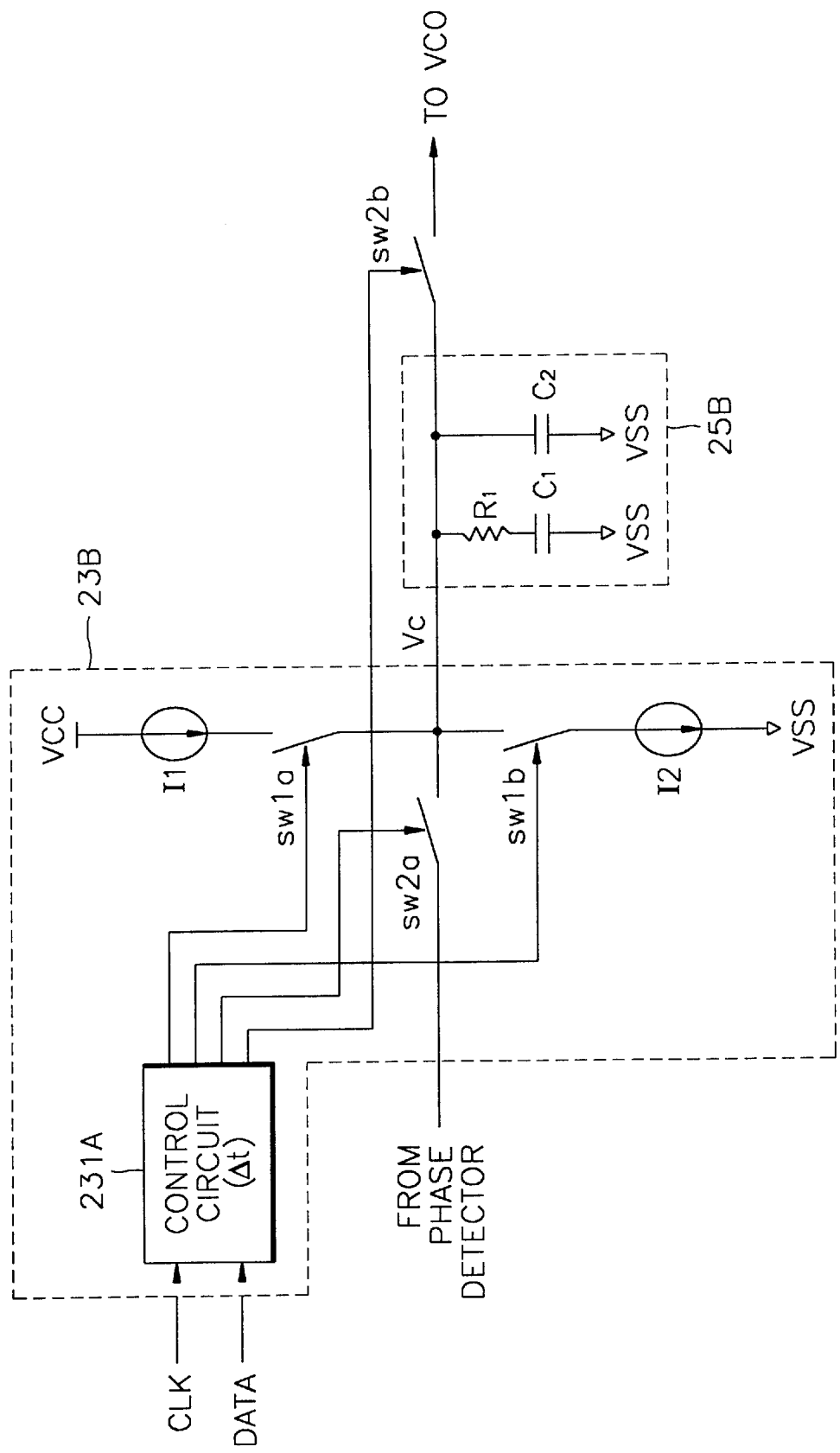

FIGS. 5 and 6 show circuit diagrams illustrating a second embodiment of the fast frequency lock control circuit of FIG. 2. FIG. 5 illustrates a case where the loop filter is a first order loop filter 25A, and FIG. 6 illustrates a case where the loop filter is a second order loop filter 25B.

Referring now to FIGS. 5 and 6, a fast frequency lock control circuit ("FFLC") 23B according to the second embodiment includes a first constant current source I1, one end of which is connected to supply voltage VCC, a first switch sw1a which is connected between the other end of the first constant current source I1 and a loop filter 25A or 25B, a second switch sw2a which is connected between the phase detector 21 and the loop filter 25A or 25B, a second constant current source I2, one end of which is connected to ground voltage VSS, a third switch sw1b which is connected between the other end of the second constant current source I2 and the loop filter 25A or 25B, and a control circuit 231A. A fourth switch sw2b is connected between the loop filter 25A or 25B and the VCO 27.

The control circuit 231A turns on the first switch sw1a and turns off the third switch sw1b, the second switch sw2a, and the fourth switch sw2b for a predetermined time duration Δt in response to input data DATA and a control clock signal CLK in order to increase control voltage Vc in a case where the value Vc2 of the later state of the control voltage Vc is larger than the value Vc1 of the initial state of the control voltage Vc. As a result, current is supplied to the loop filters 25A and 25B for the predetermined time duration Δt.

Also, the control circuit 231A turns off the first switch sw1a, turns on the third switch sw1b, and turns off the second switch sw2a and the fourth switch sw2b, for the predetermined time duration Δt in response to the input data DATA and the control clock signal CLK in order to decrease the control voltage Vc in a case where the value Vc2 of the later state of the control voltage Vc is smaller than the value Vc1 of the initial state of the control voltage Vc. As a result, current is emitted from the loop filters 25A and 25B for the predetermined time duration Δt.

The control circuit 231A turns off the first switch sw1a and the third switch sw1b and turns on the second switch sw2a and the fourth switch sw2b after the predetermined time duration Δt.

The reason why the second switch sw2a and the fourth switch sw2b are turned off for the predetermined time duration Δt, that is, during the operation period of the fast frequency lock control circuit 23B, is to disable operation of the phase detector 21, the VCO 27, and the divider 29 excluding the fast frequency lock control circuit 23B and the loop filters 25A and 25B during the period and to reduce power consumption.

As described above, the fast frequency lock control circuit 23B according to the second embodiment of the present disclosure can be applied to cases where the value Vc2 of the later state of the control voltage Vc is larger than and cases where it is smaller than the value Vc1 of the initial state of the control voltage Vc.

Preferably, the input data DATA is the same as a division rate N of the divider 29 of FIG. 2, and the control clock signal CLK is the same as the reference clock signal fr of FIG. 2, like in the first embodiment. However, externally applied data may be used as the input data DATA, and a clock signal may be used as the control clock signal CLK. In addition, the control circuit 231A may be implemented by a lock-detecting counter included in the PLL circuit, and the first and second constant current sources I1 and I2 may be implemented by a charge pump included in the phase detector 21.

As described above, the PLL circuit according to the present disclosure includes a fast frequency lock control circuit, thereby reducing frequency lock time and improving operational characteristics.

While this disclosure has been particularly shown and described with reference to preferred embodiments thereof, it will be understood by those skilled in the art that various changes in form and details may be made therein without departing from the spirit and scope of the disclosure as defined by the appended claims.

What is claimed is:

1. A phase-locked loop circuit comprising:
   a phase detector for comparing the phase of a reference clock signal with the phase of a feedback clock signal and detecting a phase difference therebetween;
   a loop filter in signal communication with the phase detector;
   a fast frequency lock control circuit in signal communication with the phase detector for disconnecting the phase detector from the loop filter at the initial stage of power on of the phase-locked loop circuit, at least one of supplying constant current to the loop filter for a predetermined time duration and emitting constant current from the loop filter, and then connecting the phase detector to the loop filter;
   a voltage controlled oscillator in signal communication with the loop filter for generating an output clock signal and varying the frequency of the output clock signal in response to output voltage of the loop filter; and
   a divider in signal communication with the voltage controlled oscillator for dividing the output clock signal at a predetermined division rate and supplying the divided clock signal as the feedback clock signal.

2. The phase-locked loop circuit as claimed in claim 1, wherein the fast frequency lock control circuit comprises:

a constant current source, one end of which is maintained at a first reference voltage;

a first switch connected between the other end of the constant current source and the loop filter;

a second switch connected between the phase detector and the loop filter; and a control circuit for turning on the first switch and turning off the second switch for the predetermined time duration, and for turning off the first switch and turning on the second switch after the predetermined time duration, in response to input data and a control clock signal.

3. The phase-locked loop circuit as claimed in claim 2, wherein the input data is the division rate of the divider.

4. The phase-locked loop circuit as claimed in claim 2, wherein the control clock signal is the same as the reference clock signal.

5. The phase-locked loop circuit as claimed in claim 2, wherein the control circuit is implemented by a lock-detecting counter included in the PLL circuit.

6. The phase-locked loop circuit as claimed in claim 2, wherein the constant current source is implemented by a charge pump included in the phase detector.

7. The phase-locked loop circuit mode as claimed in claim 1, wherein the fast frequency lock control circuit comprises:

a first constant current source, one end of which is maintained at a first reference voltage;

a first switch connected between the other end of the first constant current source and the loop filter;

a second switch connected between the phase detector and the loop filter;

a second constant current source, one end of which is maintained at a second reference voltage;

a third switch connected between the other end of the second constant current source and the loop filter;

a fourth switch connected between the loop filter and the voltage controlled oscillator ("VCO"); and a control circuit for turning on one of the first switch and the third switch and turning off the second switch and the fourth switch for the predetermined time duration, and for turning off the first switch and the third switch and turning on the second switch and the fourth switch after the predetermined time duration, in response to input data and a control clock signal.

8. The phase-locked loop circuit as claimed in claim 7, wherein the input data is the division rate of the divider.

9. The phase-locked loop circuit as claimed in claim 7, wherein the control clock signal is the same as the reference clock signal.

10. The phase-locked loop circuit as claimed in claim 7, wherein the control circuit is implemented by a lock-detecting counter included in the phaselocked loop circuit.

11. The phase-locked loop circuit as claimed in claim 7, wherein the first constant current source and the second constant current source are implemented by a charge pump included in the phase detector.

12. A method for reducing frequency lock time of a phase-locked loop circuit comprising a phase detector for comparing the phase of a reference clock signal with the phase of a feedback clock signal and detecting a phase difference, a loop filter, a voltage controlled oscillator for generating an output clock signal and varying the frequency of the output clock signal in response to output voltage of the loop filter, and a divider for dividing the output clock signal at a predetermined division rate and supplying the divided clock signal as the feedback clock signal, the method comprising:

disconnecting the phase detector from the loop filter at the initial stage of power on of the phase-locked loop circuit;

at least one of supplying constant current to the loop filter for a predetermined time duration and emitting constant current from the loop filter; and connecting the phase detector to the loop filter after the predetermined time duration.

13. The method as claimed in claim 12, wherein supplying the constant current to the loop filter comprises:

generating the constant current; and connecting a path of the constant current to the loop filter and disconnecting the phase detector from the loop filter for the predetermined time duration in response to input data and a control clock signal.

14. The method as claimed in claim 13, wherein the input data is the division rate of the divider.

15. The method as claimed in claim 13, wherein the control clock signal is the same as the reference clock signal.

16. A phase-locked loop circuit comprising:

means for comparing the phase of a reference clock signal with the phase of a feedback clock signal and detecting a phase difference therebetween;

means for filtering a signal indicative of the detected phase difference;

means for disconnecting the detecting means from the filtering means at the initial stage of power on of the phase-locked loop circuit, at least one of supplying constant current to the filtering means for a predetermined time duration and emitting constant current from the filtering means, and then connecting the detecting means to the filtering means;

means for generating an output clock signal and varying the frequency of the output clock signal in response to the filtering means; and means for dividing the output clock signal at a predetermined division rate and supplying the divided clock signal as the feedback clock signal.

17. A phase-locked loop circuit as defined in claim 16, further comprising:

means for generating the constant current for supplying to the filtering means.

18. A phase-locked loop circuit as defined in claim 17, further comprising:

means for connecting the generating means to the filtering means and disconnecting the detecting means from the filtering means for the predetermined time duration in response to input data and a control clock signal.

19. A phase-locked loop circuit as defined in claim 18 wherein the input data is the division rate of the dividing means.

20. A phase-locked loop circuit as defined in claim 18 wherein the control clock signal is the same as the reference clock signal.

* * * * *